US005189706A

United States Patent [19]

Saeki

[11] Patent Number: 5,189,706

[45] Date of Patent: Feb. 23, 1993

[54] ACOUSTIC APPARATUS

[75] Inventor: Tatsuo Saeki, Hamamatsu, Japan

[73] Assignee: Yamaha Corporation, Hamamatsu, Japan

[21] Appl. No.: 467,980

[22] Filed: Jan. 22, 1990

[30] Foreign Application Priority Data

Jan. 23, 1989 [JP] Japan ................................ 1-5447[U]

[51] Int. Cl.[5] ...................... H04R 25/00; H04R 7/00; H05K 5/00

[52] U.S. Cl. .................................. 381/159; 181/156; 181/155; 181/160

[58] Field of Search ................ 381/159; 181/156, 148, 181/145, 155, 160, 199

[56] References Cited

U.S. PATENT DOCUMENTS

| | | | |
|---|---|---|---|
| 3,529,691 | 9/1970 | Wesemann | 181/156 |
| 3,912,866 | 10/1975 | Fox | 181/155 |
| 4,146,111 | 3/1979 | Mae et al. | 181/156 |
| 4,210,223 | 7/1980 | Gillum et al. | 181/156 |
| 4,230,905 | 10/1980 | Crum et al. | 381/159 |
| 4,298,087 | 11/1981 | Launay | 181/156 |
| 4,549,631 | 10/1985 | Bose | 181/155 |
| 4,733,749 | 3/1988 | Newman et al. | 181/155 |
| 4,783,820 | 11/1988 | Lyngdorf et al. | 181/145 |
| 4,949,386 | 8/1990 | Hill | 181/156 |

FOREIGN PATENT DOCUMENTS

| | | | |
|---|---|---|---|
| 109966 | 5/1940 | Australia | 181/156 |
| 0286096 | 11/1988 | Japan | 381/159 |

*Primary Examiner*—James L. Dwyer
*Assistant Examiner*—Jason Chan
*Attorney, Agent, or Firm*—Spensley Horn Jubas & Lubitz

[57] ABSTRACT

An acoustic apparatus comprises an inner cabinet, a vibrator mounted thereon and an outer cabinet. The inner cabinet and the outer cabinet constitute an acoustic cabinet having a closed cavity. The outer cabinet covers the inner cabinet with a predetermined gap formed between the inner peripheral surface of the outer cabinet and the outer peripheral surface of the inner cabinet and has an opening causing the gap to communicate with the external region of the acoustic cabinet and to function as a resonance port. The resonance port and the closed cavity constitute a resonator. The vibrator is provided so as to face the closed cavity. The resonator radiates a resonant sound from the open end of the gap, i.e., the resonance port, upon being driven by the vibrator.

2 Claims, 5 Drawing Sheets

ACOUSTIC APPARATUS

BACKGROUND OF THE INVENTION

1. Field of the Invention

The present invention relates to an acoustic apparatus comprising a Helmholtz resonator and, more particularly, to a structure of an acoustic cabinet with a resonance port constituting the Helmholtz resonator.

2. Description of the Prior Art

As an acoustic apparatus utilizing Helmholtz resonance, a phase-inversion type (bass-reflex type) speaker system is known. FIGS. 5A and 5B are respectively a perspective view and a sectional view showing an arrangement of a bass-reflex speaker system. In the speaker system shown in FIGS. 5A and 5B, a hole is formed in the front surface of a cabinet 21, and a vibrator (dynamic speaker unit) 24 comprising a diaphragm 22 and a transducer 23 is mounted over the hole. An open duct port 26 having a sound path 25 is arranged below the vibrator 24. In the bass-reflex speaker system according to the standard design, a resonance frequency (antiresonance frequency) $f_{op}$ caused by an air spring of the cabinet 21 and an air mass in the sound path 25 is set to be lower than the lowest resonance frequency $f_{or}$ of the vibrator 24 which is mounted on the bass-reflex cabinet or, in some cases, a lowest resonance frequency $f_o$ inherent in the vibrator. At a frequency higher than the antiresonance frequency $f_o$, the phase of a sound pressure from the rear surface of the diaphragm 22 is reversed at the sound path 25. In front of the cabinet 21, a direct radiation sound from the front surface of the diaphragm 22 and a sound from a port opening portion 27 are consecutively in phase with each other and are in-phase added to each other, thus increasing a sound pressure. More specifically, the lowest resonance frequency of the system can be expanded to the antiresonance frequency $f_{op}$ of the resonator by this in-phase addition. As a result, according to the optimally designed bass-reflex type speaker system, frequency characteristics of an output sound pressure can be expanded below the resonance frequency $f_{oc}$ or $f_o$ of the vibrator 24. As indicated by an alternate long and two short dashed curve in FIG. 6, a uniform reproduction range can be widened as compared to that of an infinite plane baffle or a closed baffle.

The conventional speaker cabinet structure in the bass-reflex acoustic apparatus employs a structure in which the prismatic or cylindrical resonance port 26 is mounted on the front surface of the cabinet 21, as shown in FIG. 5B, or a structure in which the lower surface of the cabinet 21 is doubled, and a space between these lower surfaces is used as the sound path 25 to constitute the resonance port 26, as shown in FIG. 7.

However, in the conventional speaker cabinet structure, the length of the resonance port is limited depending on the size of the cabinet, and a predetermined resonance frequency cannot always be obtained. The baffle area of the opening surface of the resonance port is increased, and the speaker cabinet becomes large in size.

SUMMARY OF THE INVENTION

The present invention has been made in consideration of the above situation, and has as its object to provide an acoustic apparatus comprising an acoustic cabinet with a resonance port, which widens a reproduction frequency range by efficiently lowering the resonance frequency of the resonance port and makes the entire cabinet compact.

In order to achieve the above object, an acoustic apparatus according to the present invention comprises an inner and outer cabinets and a vibrator. The inner and outer cabinets constitute an acoustic cabinet in which a closed cavity is formed. The outer cabinet covers the inner cabinet so as to form a predetermined gap between the inner peripheral surface of the outer cabinet and the outer peripheral surface of the inner cabinet and has an opening at one of the top and bottom surfaces thereof. The opening enable the gap to communicate with the external region of the acoustic cabinet. Thereby, the gap between the inner and outer cabinets serves as the sound path of a resonance port which causes the closed cavity to communicate with the external region, the closed cavity and the resonance port constituting a resonator. The open end of the gap is formed on the peripheral portion of the inner cabinet and serves as the resonance radiation portion of the resonator. The vibrator is mounted on the inner cabinet and faced to the closed cavity to drive the resonator. Thus, peripheral portion of the acoustic cabinet can be efficiently utilized as the resonance port, and the acoustic cabinet according to the present invention can be made compact.

DETAILED DESCRIPTION OF THE PREFERRED EMBODIMENTS

Figure 1:
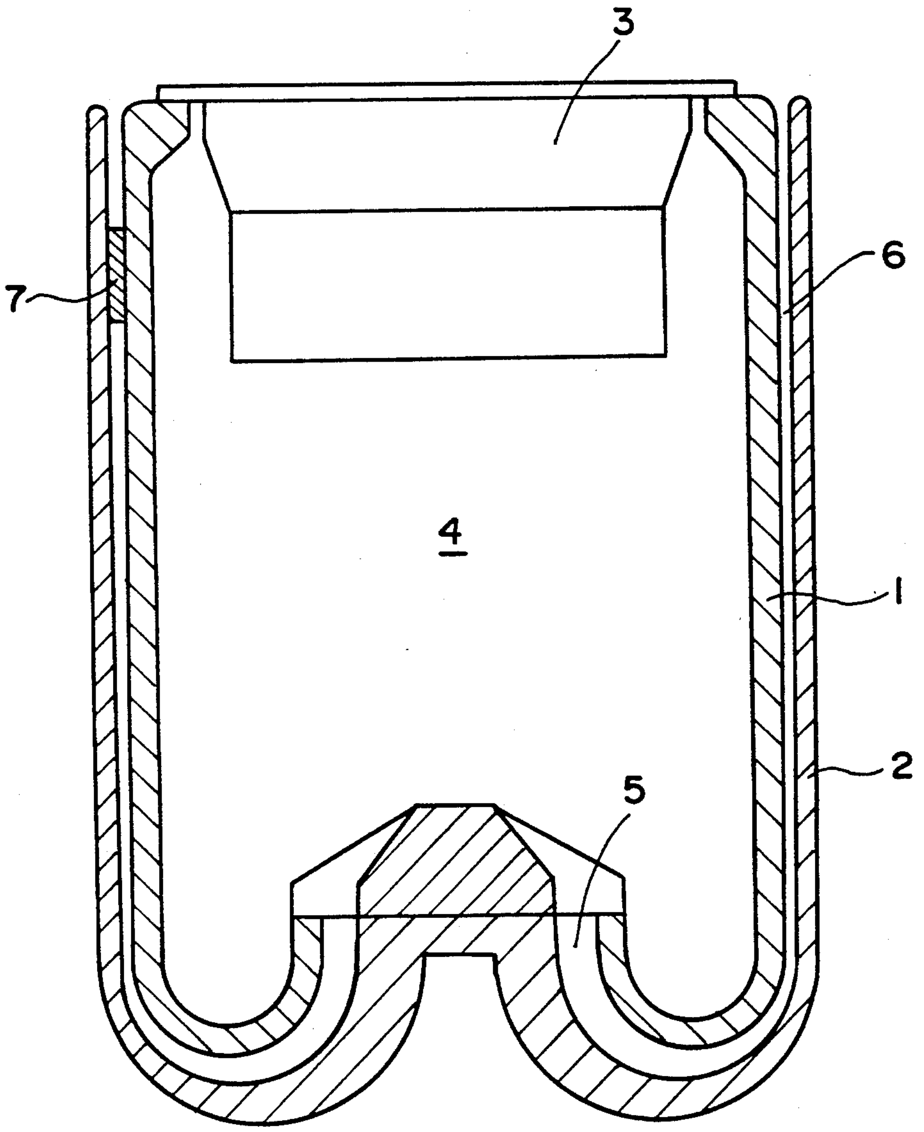
FIG. 1 is a longitudinal sectional view of a speaker cabinet with a resonance port according to the present invention.
Figure 2:
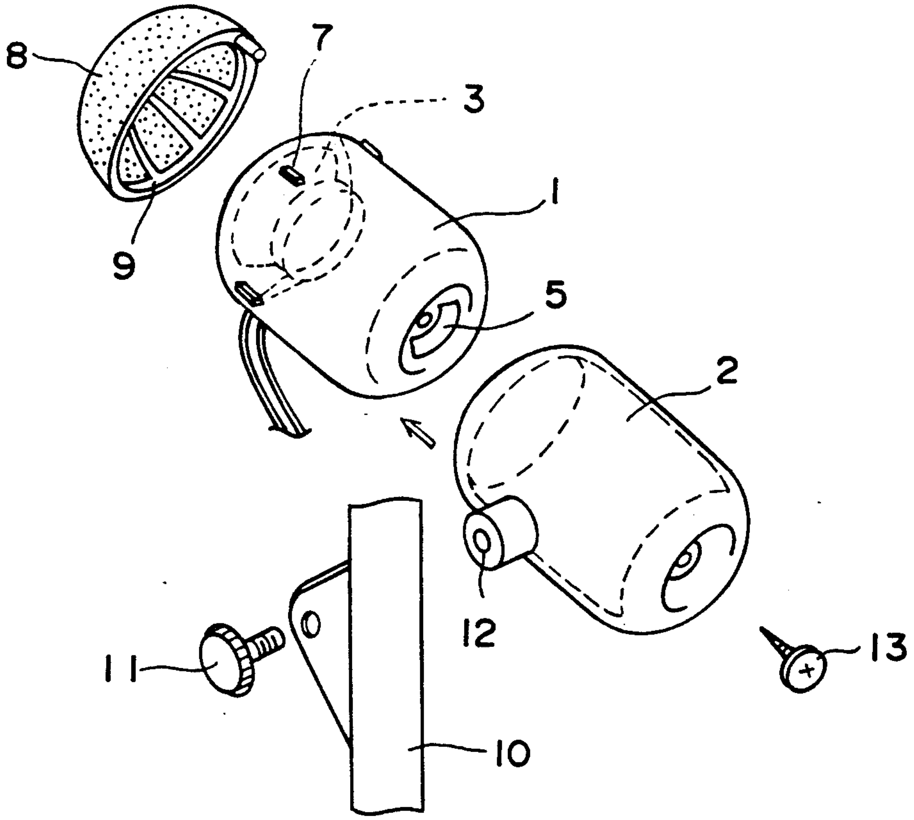
FIG. 2 is an exploded perspective view of the speaker cabinet shown in FIG. 1.
Figure 3:
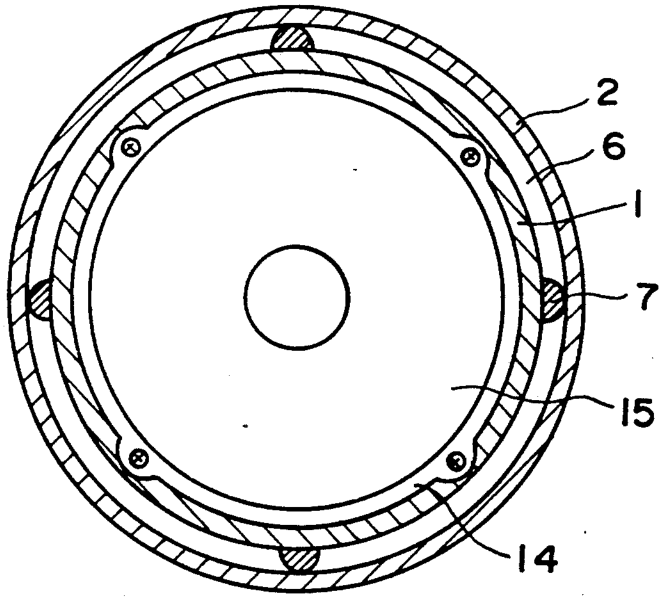
FIG. 3 is a cross-sectional view of the speaker cabinet shown in FIG. 1.

FIG. 1 is a longitudinal sectional view of a speaker cabinet with a resonance port according to the present invention, FIG. 2 is an exploded perspective view of FIG. 1, and FIG. 3 is a cross-sectional view of FIG. 1. A speaker 3 is mounted on a cylindrical inner cabinet 1. The inner cabinet 1 is entirely covered by an outer cabinet 2 except one end surface of the inner cabinet 1 to have an open speaker sound output surface (front or top surface). The inner and outer cabinets 1 and 2 are fixed to each other by a screw 13 (FIG. 2). A gap 6 constituting a resonance port is formed between the inner and outer cabinets 1 and 2. Reference numeral 7 denotes a spacer. An opening portion 5 is formed on the rear surface of the inner cabinet 1 to cause an internal space 4 of the inner cabinet 1 to communicate with the gap 6. A protection member 8 mounted on a frame 9 is attached to the front surface of the speaker 3. The double-structure cabinet is fixed to a support frame 10 by threadably engaging a screw 11 with a screw hole 12 of the outer cabinet. Reference numeral 14 (FIG. 3) denotes a speaker frame; and 15, a diaphragm.

A Helmholtz resonator is formed by the gap 6 of the double structure cabinet and the internal space 4 of the inner cabinet 1. The gap 6 serves as a resonance port of the Helmholtz resonator and the internal space 4 serves as a closed cavity thereof. The double-structure cabinet serves as a similar speaker system with resonance port as a bass-reflex speaker system.

In the above structure, the resonance frequency $f_p$ of the Helmholtz resonator is given by:

$$f_p = \frac{c}{2\pi} \cdot \sqrt{\frac{S_p}{L_p \cdot V_c}}$$

where $L_p$ is the length of the resonance port defined by the gap 6, $S_p$ is the area of the open end portion of the gap 6, $V_c$ is the inner volume of the inner cabinet 1, and c is the sonic speed.

In the speaker cabinet with the resonance port with the above structure, since the portion around the entire outer peripheral and rear (or bottom) surfaces of the cabinet is effectively utilized as a resonance port, the resonance port can be increased in its length and area with respect to a cabinet having a predetermined volume. Therefore, the resonance frequency of the resonator can be lowered to widen a reproduction frequency range. In addition, the cabinet can be made compact.

Figure 4:
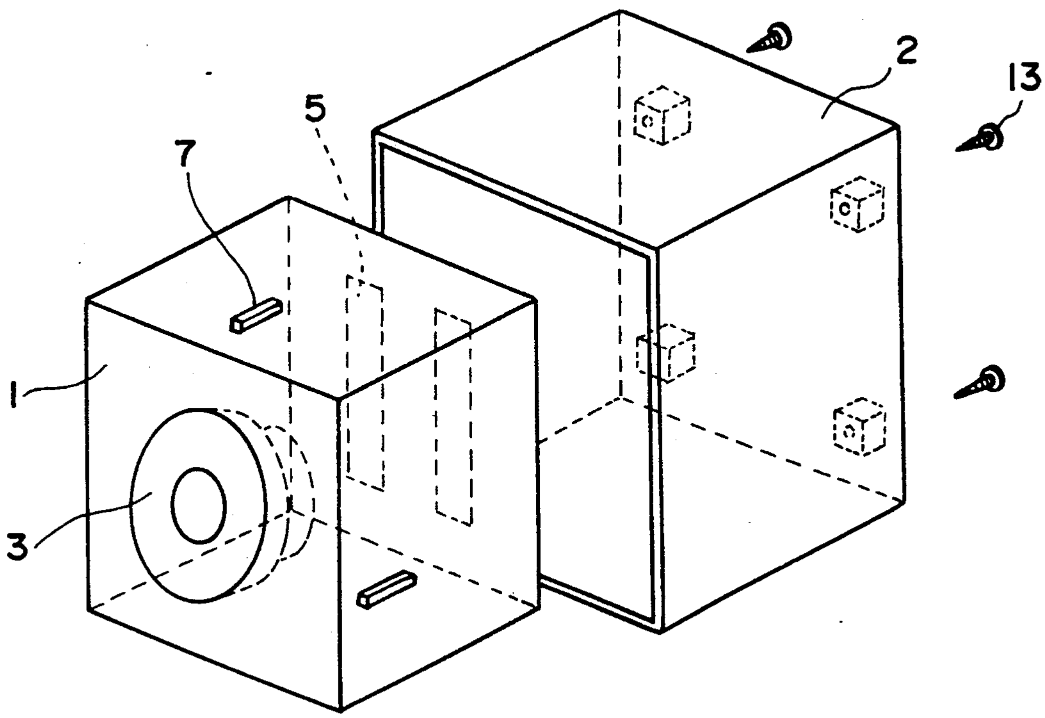
FIG. 4 is a perspective view of a second embodiment of a speaker cabinet with a resonance port according to the present invention.
Figure 7:
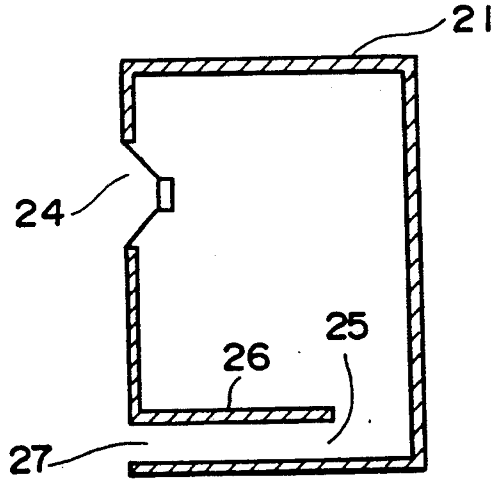
PRIOR ART FIG. 7
FIG. 7 is a sectional view of a conventional speaker cabinet.
Figure 5A:
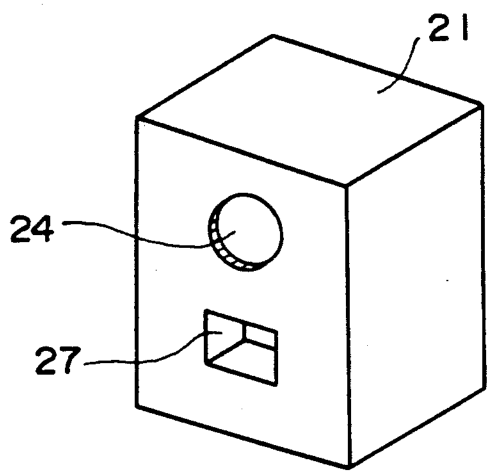
PRIOR ART FIG. 5A
FIGS. 5A and 5B, are respectively a perspective view and a sectional view for explaining the principle of a bass-reflex speaker system.
Figure 5B:
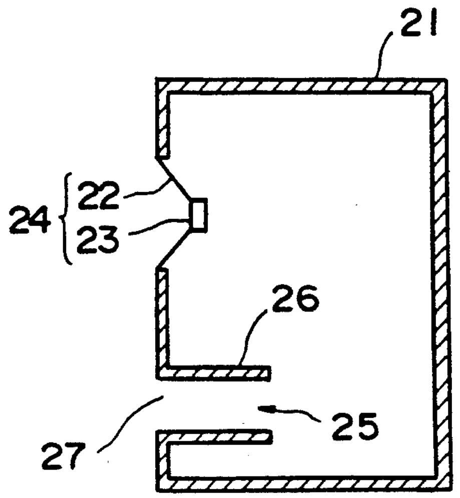
PRIOR ART FIG. 5B
Figure 6:
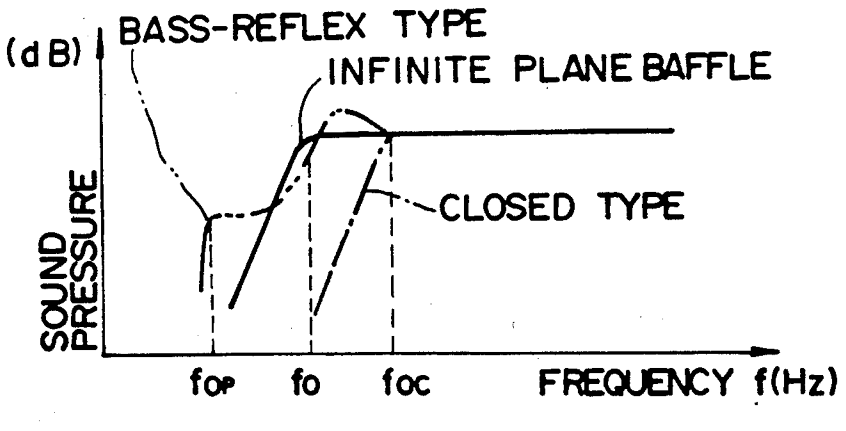
FIG. 6 is a graph showing frequency dependency of a sound pressure.

FIG. 4 is a perspective view of a second embodiment of the present invention. In this embodiment, the present invention is applied to a rectangular parallelepiped speaker cabinet. Four side surfaces and the rear surface of a rectangular parallelepiped inner cabinet 1 are covered by a rectangular parallelepiped outer cabinet 2. Other arrangements and the effects of this embodiment are the same as those of the above embodiment.

As described above, a speaker cabinet with a resonance port according to the present invention has a double-structure in almost the entire outer periphery of the cabinet, and a gap in the double structure is utilized as a resonance port. Therefore, the resonance frequency can be efficiently lowered to widen a reproduction frequency range. Especially, bass-tone characteristics can be improved. The outer dimensions of the cabinet can be reduced by effectively utilizing the outer periphery of the cabinet.

Figure 8:
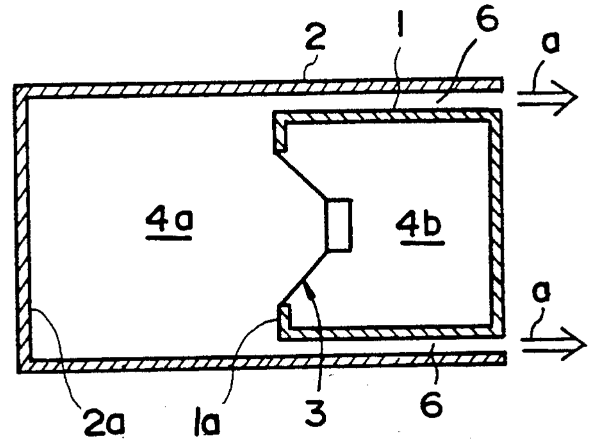
FIGS. 8-10 respectively show a third to a fifth embodiments of the speaker cabinet with a resonance port according to the present invention.

FIG. 8 shows the construction of a bass-reflex speaker system as a third embodiment of the present invention. The speaker cabinet shown in FIGS. 1 and 3 uses the internal space of the inner cabinet 1 as the closed cavity for the Helmholtz resonator, whereas the speaker cabinet shown in FIG. 8 uses a gap, somewhat widened, between the outer bottom surface (rear surface) 1*a* and the inner bottom surface 2*a* of the outer cabinet 2 for use as a closed cavity 4*a* for constructing a Helmholtz resonator. A gap 6 between the side surface (or peripheral surface) 1*b* of the inner cabinet 1 and that 2*b* of the outer cabinet 2 forms a resonance port for constituting a Helmholtz resonator. Further, a speaker 3 is fixed to the bottom surface 1*a* of the inner cabinet 1 so that it is faced to said closed cavity 4*a*.

Figure 9:
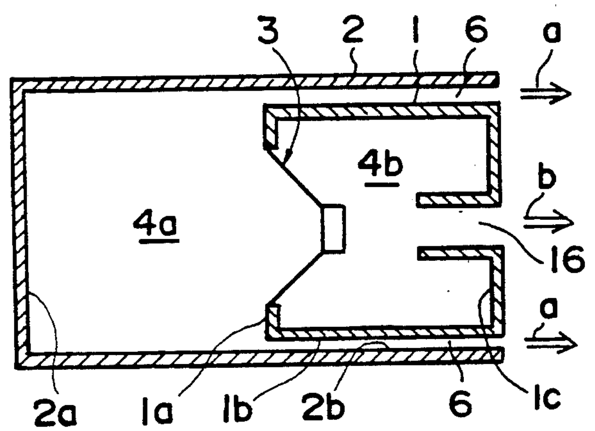

FIG. 9 shows a so-called double bass-reflex type speaker system, such as one disclosed in U.S. Pat. No. 4,549,631 specification, as a forth embodiment to which the present invention has been applied. More particularly, said speaker system is so designed that one Helmholtz resonator is driven before the diaphragm of the speaker 3 and the other behind said diaphragm, the former Helmholtz resonator being composed of not only the space (or gap) 4*a* between the outer bottom surface 1*a* of the inner cabinet 1 and the inner bottom surface 2*a* of the outer cabinet 2 but also the gap 6, like the speaker system shown in FIG. 8, while the latter Helmholtz resonator is designed to be composed of both the internal space 4*b* of the inner cabinet 1 and a resonance port 16 which is fixed to the front surface 1*c* of the inner cabinet 1 in the same manner as a conventional bass-reflex type speaker system.

Figure 10:
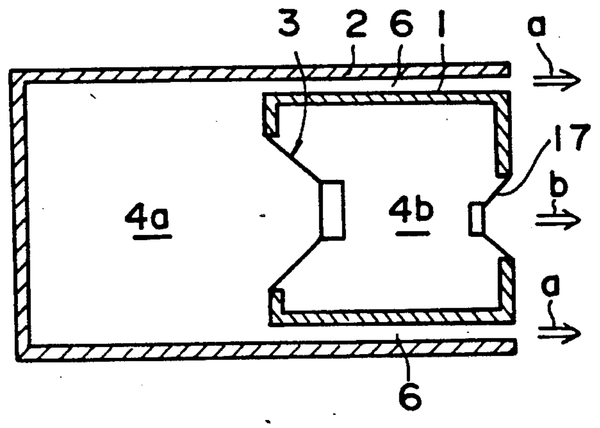

FIG. 10 shows a speaker system in which a passive radiator 17 is substituted for the resonance port 16 of FIG. 9. In this speaker system, a second resonator is composed of both the internal space 4*b* of the inner cabinet 1 and the passive radiator 17.

What is claimed is:

1. An acoustic apparatus comprising an acoustic cabinet in which a first resonance cavity is formed, a first resonance port for causing the first resonance cavity to communicate with the external region of the cabinet, the first resonance port comprising a first resonator together with the first resonance cavity and radiating a first resonance sound, and a vibrator for driving the first resonator, wherein the acoustic cabinet comprises:

an inner cabinet on which the vibrator is mounted, the inner cabinet having an outer peripheral surface extending between one end surface and an opposite other end surface thereof, the inner cabinet including a second cavity, a second resonance port for constituting a second resonator together with the second cavity and radiating a second resonance sound being provided on the one end surface of the inner cabinet; and an outer cabinet having an inner peripheral surface and an opening formed at one end surface of the outer cabinet covering the inner cabinet with a predetermined first gap being formed between the inner peripheral surface of the outer cabinet and the outer peripheral surface of the inner cabinet, the first gap extending along substantially the entire outer peripheral surface of the inner cabinet between the one end surface and the opposite other end surface, the opening causing the first gap to communicate with the external region and to function as the first resonance port, wherein the one end surface of the inner cabinet is exposed out of the opening of the outer cabinet, and a second gap wider than the first gap and serving as the first resonance cavity being formed between the other end surface of the outer cabinet opposite the opening and the other end surface of the inner cabinet and the vibrator being mounted on the other end surface of the inner cabinet.

2. An acoustic apparatus comprising an acoustic cabinet in which a first resonance cavity is formed, a first resonance port for causing the first resonance cavity to communicate with the external region of the cabinet, the first resonance port comprising a first resonator together with the first resonance cavity and radiating a first resonance sound, and a vibrator for driving the first resonator, wherein the acoustic cabinet comprises:

an inner cabinet on which the vibrator is mounted, the inner cabinet having an outer peripheral surface extending between one end surface and an opposite other end surface thereof, the inner cabinet including a second cavity, a passive radiator for constituting a second resonator together with the second cavity and radiating a second resonator sound being provided on the one end surface of the inner cabinet; and an outer cabinet having an inner peripheral surface and an opening formed at one end surface of the outer cabinet covering the inner cabinet with a predetermined first gap being formed between the inner peripheral surface of the outer cabinet and the outer peripheral surface of the inner cabinet, the first gap extending along substantially the entire outer peripheral surface of the inner cabinet between the one end surface and the opposite other end surface, the opening causing the first gap to communicate with the external region and to function as the first resonance port, wherein the one end surface of the inner cabinet is exposed out of the opening of the outer cabinet, and a second gap wider than the first gap and serving as the first resonance cavity being formed between the other end surface of the outer cabinet opposite the opening and the other end surface of the inner cabinet and the vibrator being mounted on the other end surface of the inner cabinet.

* * * * *